(12) United States Patent
Kumar

(10) Patent No.: US 9,105,626 B2
(45) Date of Patent: Aug. 11, 2015

(54) HIGH-DENSITY PACKAGE-ON-PACKAGE STRUCTURE

(71) Applicant: QUALCOMM Incorporated, San Diego, CA (US)

(72) Inventor: Rajneesh Kumar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/790,728

(22) Filed: Mar. 8, 2013

(65) Prior Publication Data

US 2014/0138826 A1 May 22, 2014

Related U.S. Application Data

(60) Provisional application No. 61/729,049, filed on Nov. 21, 2012.

(51) Int. Cl.
*H01L 23/498* (2006.01)
*H01L 25/00* (2006.01)
*H01L 25/10* (2006.01)
*H01L 23/31* (2006.01)
*H01L 23/00* (2006.01)

(52) U.S. Cl.
CPC .... *H01L 23/49816* (2013.01); *H01L 23/49822* (2013.01); *H01L 23/49827* (2013.01); *H01L 25/105* (2013.01); *H01L 25/50* (2013.01); *H01L 23/3128* (2013.01); *H01L 24/13* (2013.01); *H01L 24/16* (2013.01); *H01L 24/32* (2013.01); *H01L 24/48* (2013.01); *H01L 24/73* (2013.01); *H01L 24/81* (2013.01); *H01L 2224/131* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/81192* (2013.01); *H01L 2225/0651* (2013.01); *H01L 2225/06562* (2013.01); *H01L 2225/1023* (2013.01); *H01L 2225/1058* (2013.01); *H01L 2924/1432* (2013.01); *H01L 2924/1433* (2013.01); *H01L 2924/1434* (2013.01); *H01L 2924/15311* (2013.01); *H01L 2924/15331* (2013.01)

(58) Field of Classification Search
CPC .............. H01L 24/13; H01L 23/49816; H01L 23/49827
USPC .......................................... 257/686, E33.056
See application file for complete search history.

(56) References Cited

U.S. PATENT DOCUMENTS

| | | |
|---|---|---|
| 7,791,206 B2 | 9/2010 | Takeuchi et al. |
| 7,851,894 B1 | 12/2010 | Scanlan |
| 2010/0072600 A1 | 3/2010 | Gerber |
| 2010/0213591 A1* | 8/2010 | Ho et al. ........................ 257/686 |
| 2012/0061814 A1 | 3/2012 | Camacho et al. |

* cited by examiner

*Primary Examiner* — Amar Movva
(74) *Attorney, Agent, or Firm* — Michelle S. Gallardo

(57) ABSTRACT

A bare-die first package includes a patterned insulating layer that exposes first package balls in vias. The vias enable a second package to be positioned on the first package in a proper ball-to-ball alignment without the need for flattening or coining.

18 Claims, 8 Drawing Sheets

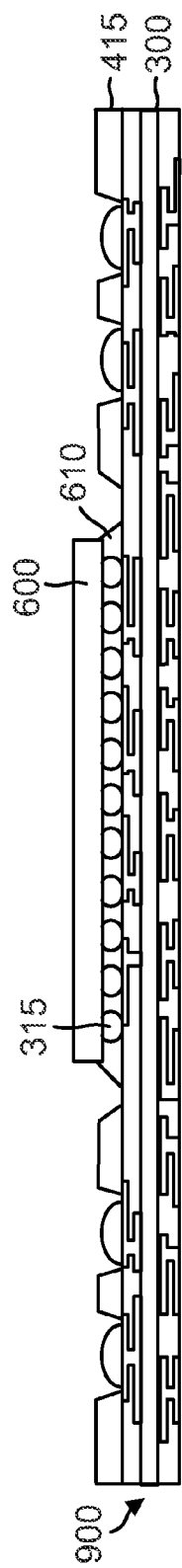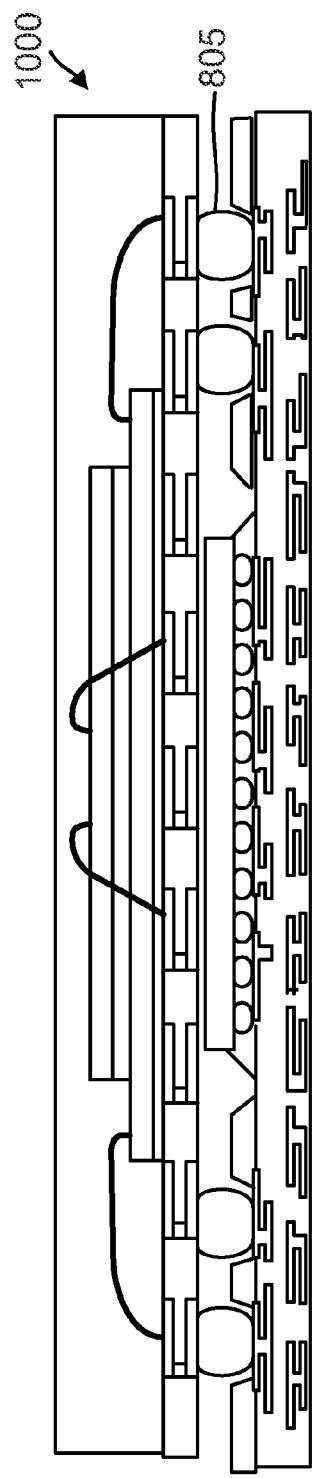

HIGH-DENSITY PACKAGE-ON-PACKAGE STRUCTURE

RELATED APPLICATION

This application claims the benefit of U.S. Provisional Application No. 61/729,049, filed on Nov. 21, 2012.

TECHNICAL FIELD

This application relates to integrated circuit packaging, and more particularly to a package-on-package (PoP) structure enhanced for high-density applications.

BACKGROUND

Package-on-package (PoP) structures have been developed for applications such as cellular telephones in which circuit board space must be conserved. The top package is typically a memory package whereas the bottom package is generally a processor package. Package-on-package technology has proven to be quite popular as compared to other approaches such a stacked-die circuit. For example, a manufacturer can readily substitute different memory packages in a PoP circuit, which thus lowers costs as opposed to being tied to a particular memory. Moreover, the top and bottom packages may be tested independently. In contrast, a bad die in a stacked-die design requires rejection of the remaining good die.

Although the packaging of integrated circuits using a PoP architecture is thus quite popular, challenges remain in this packaging process. For example, one challenge involves accommodating a decreased interconnect pitch. As technology advances, a circuit needs ever more signal pathways to achieve greater speed and versatility. To accommodate more signal pathways in the same package size, a PoP structure needs finer interconnect pitch. But the bottom package has a certain standoff height with regard to the top package (a required height or separation between the top package substrate's bottom-package-facing surface and the bottom package substrate's top-package-facing surface). In a conventional low-density PoP circuit with relatively large pitch, the standoff height of the die is readily accommodated because the solder balls can be made correspondingly large such that they can reach the bottom package substrate by spanning across the standoff height separation between the top and bottom package substrates. But as the pitch is decreased in modern designs, the solder ball size must also be decreased. This means there is a stand-off issue between the upper and lower packages for high-density (low-pitch) designs because the solder balls on the upper package cannot extend to the lower package due to the standoff height for the die on the lower package.

This standoff height issue will now be explained further using the terms "first package" and "second package" as compared to the use of bottom package and top package, respectively. The art-recognized definitions of "top package" and "bottom package" as known to those of ordinary skill in the PoP arts are not tied to any coordinate system such that a bottom package does not become a top package merely because a PoP is flipped upside down. But to avoid any ambiguity, the following discussion will designate the bottom package as a "first package" and the top package as a "second package." With these concepts in mind, the standoff height issue may be better understood with reference to a conventional PoP 100 of FIG. 1. A second package substrate 105 rests on a first package die 110 to minimize the standoff issue. Since first package die 110 is not encapsulated in mold compound, the first package may be denoted as a bare-die first package. In a fine-pitch design such as less than or equal to 0.4 mm pitch, a plurality of second package solder balls 115 projecting from a first-package-facing surface of second package substrate 105 must be made sufficiently small to accommodate such a fine pitch. Thus, second package solder balls 115 cannot contact a first package substrate 120 due to the standoff issue. Second package balls 115 are thus not providing electrical continuity between the first and second packages.

To achieve electrical continuity despite the standoff issue, a set of first package solder balls (not illustrated) may be placed on a set of pads 125 on the second-package-facing surface of first package substrate 120. Second package solder balls 115 may then reach to these first package solder balls, thus solving the stand-off problem. But it is problematic to have unguided ball-to-ball coupling in that the round shapes inherently lead to misalignment. Thus, it is often necessary to flatten or coin the first package solder balls such that they have a flat surface instead of a rounded surface. Such processing steps add cost and complication to modern high-density designs. To reduce the standoff issue further, first package die 110 can itself be ground down to achieve a lower standoff height. For example, first package 110 may need to be ground to approximately 0.06 mm to achieve a standoff height of approximately 0.13 mm. In this fashion, second package solder balls 115 having a pitch of 4 mm or less can reach to first package substrate 120. But that leaves the ground-down die very fragile and prone to breaking. Moreover, the grinding of the die is expensive.

To avoid the need for solder ball flattening or coining, it is also conventional to use an over-molded first package in which the first package solder balls and first package die 110 on first package substrate 120 are encapsulated with an suitable encapsulating agent such an epoxy mold compound (EMC) or resin 130 as shown in FIG. 2 for an over-mold PoP structure 200. Vias are then laser ablated or mechanically cut through EMC 130 to expose the first package solder balls on first package substrate 120. These vias help guide the second package solder balls into an appropriate ball-to-ball alignment with the first package solder balls when the second package is stacked onto the first package. PoP structure 200 may then be reflowed to form uniform solder structures 205 from the aligned solder balls. But the laser ablation or mechanical cutting step increases manufacturing cost and complexity for over-molded PoPs.

Accordingly, there is a need in the art for improved high-density PoP architectures.

SUMMARY

A package-on-package (PoP) structure is disclosed that includes a bare-die first package having an insulating layer such as a solder resist layer that is patterned with vias to expose first package balls on a second-package-facing surface of a first package substrate and also to expose a first package die window. The patterned first package substrate may then be tested for quality before a first package die attaches to the patterned first package substrate through the die window to form a completed first package. A thickness for the solder resist layer is at least as thick as a height for the first package balls but not as thick as a standoff height for the attached first package die. The sidewalls for each via act to center and guide a corresponding second package ball on the second package substrate during stacking of the second package onto the first package. In this fashion, the second package balls achieve a guided ball-to-ball contact with the corresponding first package balls without the need for an over-molded encapsulation of the bottom package die. The relatively-inexpensive patterned first package substrate may be tested before assembly with the second package so that it may be discarded if it does not test properly for quality. In contrast, if an over-molded first package is found to be defective after ablating vias to expose its first package balls, its relatively expensive encapsulated die is then discarded as well. Moreover, the patterning of the solder resist layer is faster and less error-prone than the ablation of vias through the epoxy mold compound in over-molded first packages.

BRIEF DESCRIPTION OF THE DRAWINGS

FIG. 9 is a cross-sectional view of a completed first package for a dual-pass reflow embodiment.

FIG. 10 is a cross-sectional view of the first package of FIG. 9 incorporated with an second package to form a reflowed pre-stack

DETAILED DESCRIPTION

Figure 1:
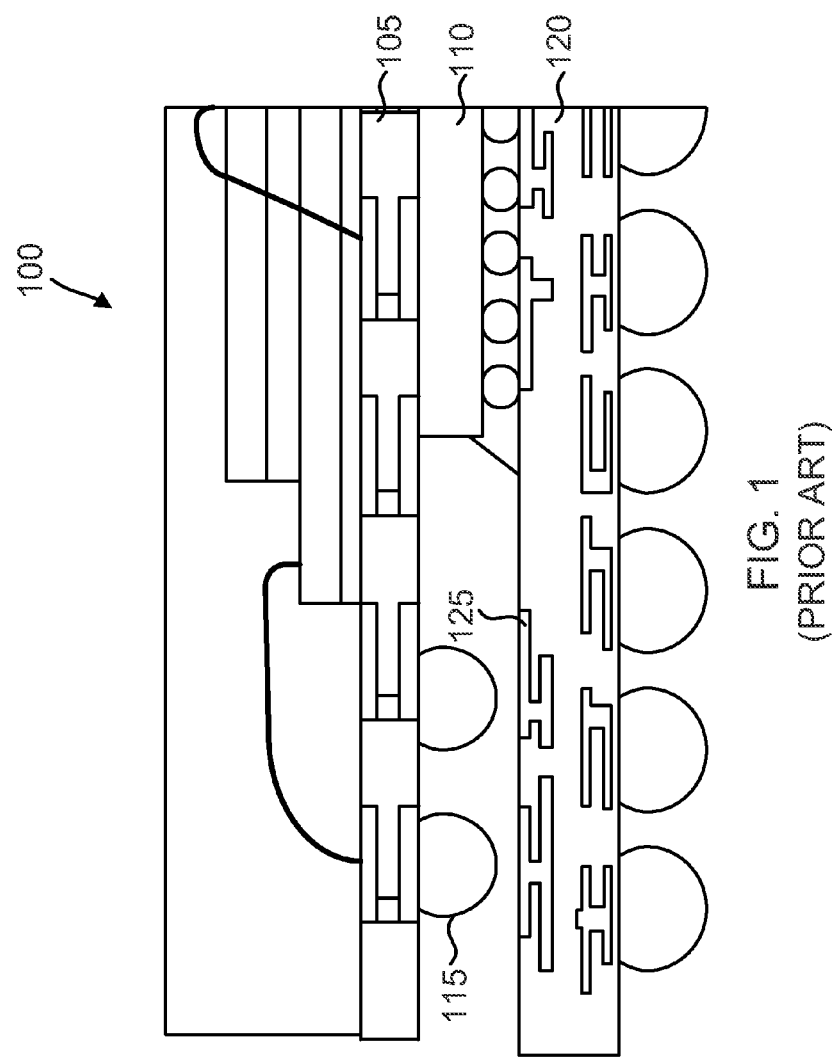
FIG. 1 is a cross-sectional view of a portion of a conventional PoP structure having a bare-die first package, wherein the pitch is too fine for the second package solder balls from the second package to span the standoff height to the first package.
Figure 2:
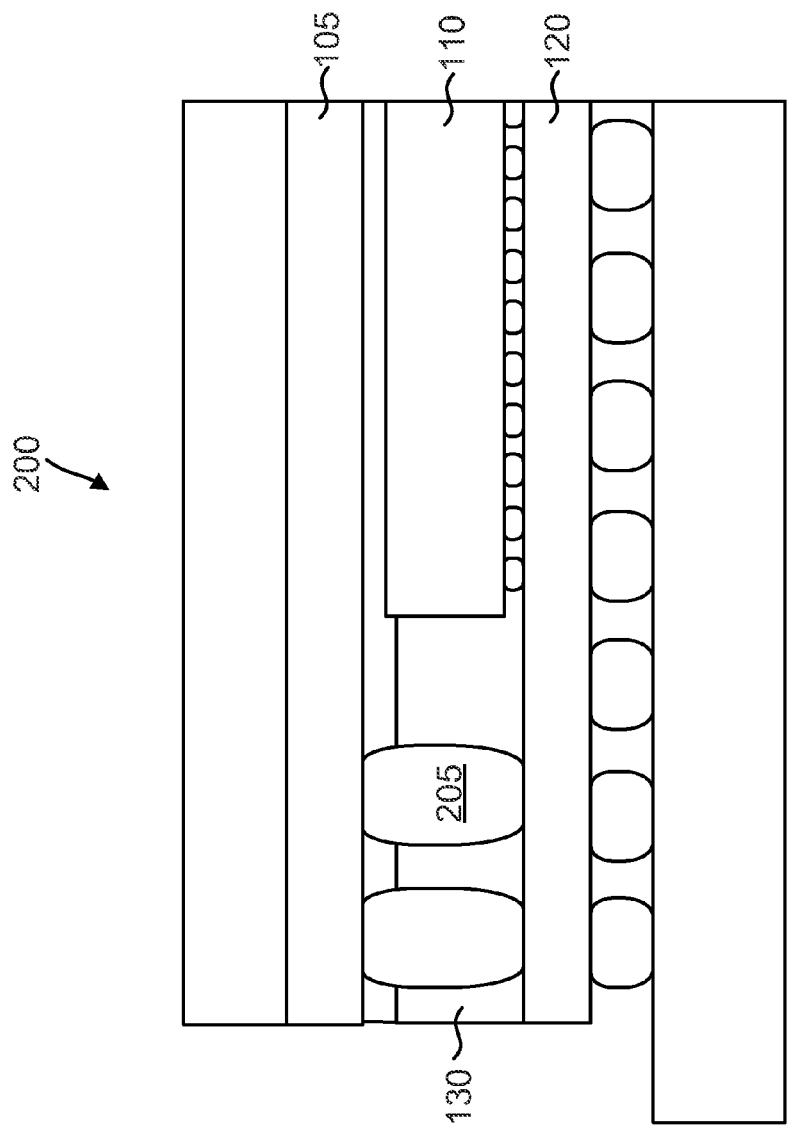
FIG. 2 is a cross-sectional view of a portion of a conventional PoP structure having an over-molded first package in which the epoxy mold compound is laser-ablated or mechanically-machined to provide vias about the solder balls on the first package.

An improved package-on-package (PoP) structure is provided that has the via-guided ball-to-ball coupling of over-molded PoP approaches without the associated cost. This improved PoP structure has a bare-die first package as discussed with regard to FIG. 1. In this fashion, there is no epoxy mold compound that needs ablating or mechanical cutting. However, the attachment or mounting of the second package onto the first package enjoys the via-guided ball-to-ball coupling achieved in an over-molded PoP as discussed with regard to FIG. 2. Moreover, because the first package is a bare-die package, the standoff height between the first and second package substrates is reduced as compared to an analogous over-molded PoP.
Overview To obtain the advantages of an over-molded PoP without its associated costs, the first package substrate includes a patterned insulating layer on its second-package-facing surface such as a patterned solder resist layer. In that regard, it is known to apply a solder resist layer before application of the first package interconnects such as solder balls, bumps, pillars or other suitable structures. Such a conventional solder resist layer prevents the solder from bleeding outside of its intended locations. In an embodiment in which the insulating layer is a solder resist layer, it would thus be a second resist layer with regard to the pre-existing conventional solder resist layer (if such a conventional solder resist layer is implemented).

Note that a first package substrate may include two types of first package interconnects on its second-package-facing surface. Should the first package die be a flip-chip die, then one type of first package interconnect would be a flip-chip interconnect such as flip-chip bump or pillar. But the first package interconnects also include package-to-package interconnects intended to couple to interconnects on the second package substrate. The following discussion will refer to these types of interconnects as first package balls to distinguish them from the first package interconnects used to couple to the first package die. A first package ball may comprise a solder ball or bump, a copper pillar, or another suitable structure for a package-to-package coupling.

In contrast to a conventional solder resist layer, the insulting layer disclosed herein is deposited or applied onto the second-package-facing surface of the first package substrate so as encapsulate the first package balls. The insulating layer may then be patterned with vias to expose each first package ball in a corresponding via. But note the difference from the patterning of the EMC for an over-molded PoP: the insulating layer is thick enough to encapsulate the first package balls but is thinner than a standoff height for the first package die. The resulting first package is thus a bare-die first package. Since the insulating layer is thinner than the EMC that would encapsulate the first package die as in an over-molded application, the formation of the vias in the insulating layer is less prone to error and less costly as compared to an over-molded EMC layer patterning. As known in the PoP arts, the second package substrate includes second package balls on its first-package-facing surface for coupling to the first package balls. But the resulting ball-to-ball coupling between the first package balls and the second package balls requires no coining or flattening of these balls. There is no need for such coining or flattening of the first and/or second package balls because the insulating layer vias serve to guide the second package balls into a ball-to-ball coupling with the first package balls. Additional features of the improved PoPs disclosed herein are discussed with regard to the following example embodiments and their methods of manufacturing.

Example Embodiments and their Manufacture

Figure 3:
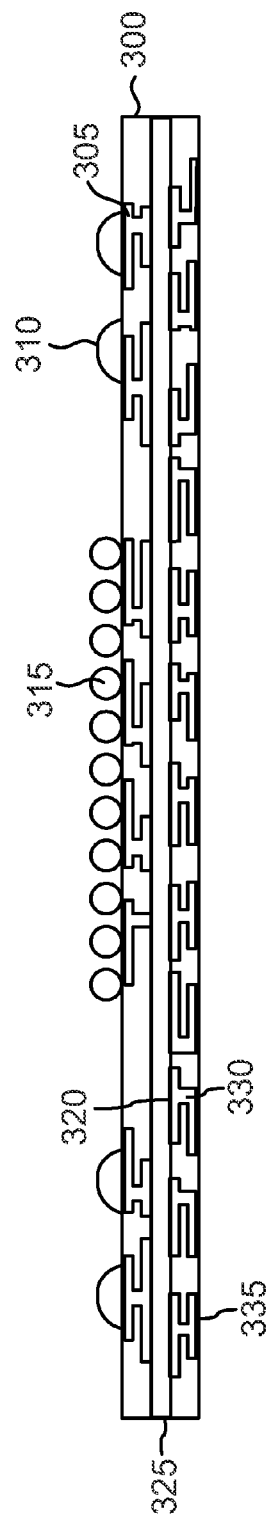
FIG. 3 is a cross-sectional view of a first package substrate that has been pre-soldered in accordance with an embodiment of the disclosure.

A first embodiment may be manufactured as follows. The manufacturing process may begin as shown in FIG. 3 by depositing a plurality of first package balls 310 and flip-chip (FC) bumps 315 over a corresponding plurality of pads 305 on a second-package-facing surface of a first package substrate 300. Balls 310 may comprise solder balls, copper pillars, or other types of package-to-package interconnects. As known in the PoP arts, substrate 300 may include a plurality of metal layers 320 separated by intervening insulating layers 325. Metal layers 320 may be patterned into conducting leads that couple to each other through metal-plated vias 330 passing through insulating layer(s) 325. Alternatively, one or more of metal layers 320 may be configured as ground planes or power supply planes. In this fashion, substrate 300 is configured to electrically couple a particular ball 310 or bump 315 through metal layers 320 and appropriate ones of vias 330 to a particular pad (or pads) from a set of pads 335 on a circuit-board-facing surface of substrate 300.

First package substrate 300 is shown including the complication of multiple metal layers because it is conventional in the PoP arts that the first package includes a high-performance processor such as a base-band processor, an application processor, or other types of ASICs. Such an integrated circuit uses a relatively large number of input and output signals that may be accommodated using a flip-chip mounting. However, it will be appreciated that the first package die (discussed further below) for the first package may be wire-bonded to substrate 300. In that regard, alternative embodiments for first package substrate 300 would not include the multiple metal layers 320. For example, substrate 300 could simply have its opposing surface pads connected with straight-through metal-plated vias. Such a substrate design will be discussed below with regard to the second package.

The second package may comprise a memory package, which uses relatively fewer input and output signals as compared to a processor package. Thus, the second package die in some embodiments may be wire-bonded as opposed to the use of a flip-chip mounting. Although the following discussion will address a processor first package/memory second package PoP embodiment, it will be appreciated that the first and second packages disclosed herein are not so limited but may instead accommodate whatever circuit one wants to put on the included dies. Moreover, although the following discussion addresses an embodiment in which the first package die is flip-chip mounted whereas the second package die(s) is wire-bonded, the first and second packages disclosed herein also not limited to these particular die mounting techniques.

Conventional ball placement techniques may be used to deposit first package balls 310 and pre-solder bumps 315 on pads 305. For example, a two-step solder paste screening and reflow process may be used to form first package balls 310 and pre-solder FC bumps 315. Alternatively, first package balls 310 and pre-solder FC bumps 315 may be formed in one step. Depending upon the deposition process used, a solder resist layer (not illustrated) may first be applied to the second-package facing surface of first package substrate 300 and patterned accordingly.

Figure 4:
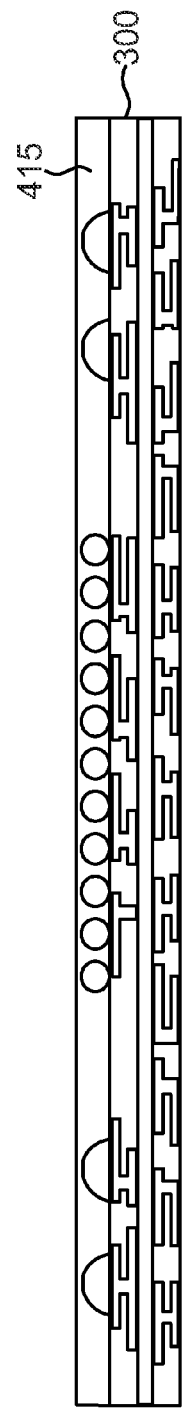
FIG. 4 is a cross-sectional view of the substrate of FIG. 3 modified with a solder-resist layer that covers the pre-solder features.
Figure 5:
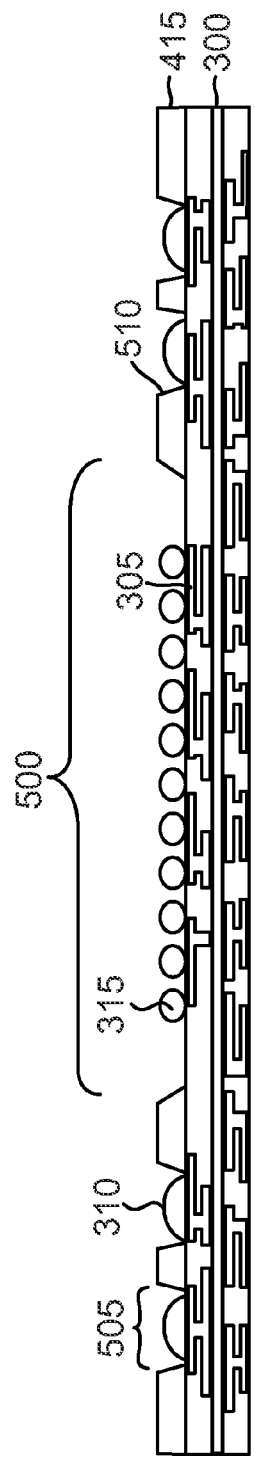
FIG. 5 is a cross-sectional view of the substrate of FIG. 4 after the solder resist layer has been patterned.

As shown in FIG. 4, the deposited balls 310 and FC bumps 315 are covered with an insulating layer such as a dry film or solder resist layer 415. In that regard, solder resist layer 415 may be denoted as a "second solder resist layer" as a first solder resist layer may have been applied prior to the attachment of first package balls 310 and FC bumps 315. The thickness of solder-resist layer 415 need only be sufficient to cover these elements. Thus, the solder-resist layer thickness is at least as thick as a height for first package balls 310. In one embodiment, the thickness of the solder-resist layer 415 may range from 10 microns to 100 microns. However, the thickness of solder-resist layer 415 may be thinner or thicker than such a range. As discussed further herein, the thickness of solder resist layer 415 may, however, be constrained to be less than the standoff height of the first package die that will be attached to first package substrate 300. A chemical etching or photo-ablation process is then used to expose FC bumps 315 through a die window 500 in layer 415 as shown in FIG. 5. This process also exposes first package balls 310 in corresponding vias 505 through solder resist layer 415. Alternatively, layer 415 may be patterned using a laser ablation process.

In an alternative embodiment, the insulating layer such as solder resist layer 415 may be applied using a mask such that it includes a die window in its formation. The patterning of such an insulating layer would thus involve only the formation of the vias in that the die window would be pre-existing. Regardless of how the die window is formed, it completely exposes FC bumps 315 as a set.

In contrast to such a group exposure, each first package ball 310 is exposed through its own individual via 505 in solder-resist layer 415. Since solder-resist layer 415 originally encapsulated first package balls 310, it will be appreciated that the thickness or height for solder-resist layer 415 is at least the same as the height for first package balls 310 or thicker than such a height. This is quite advantageous in that sidewalls 510 of vias 505 will thus act to channel or guide the second package balls from the second package substrate as discussed further below.

Figure 6:
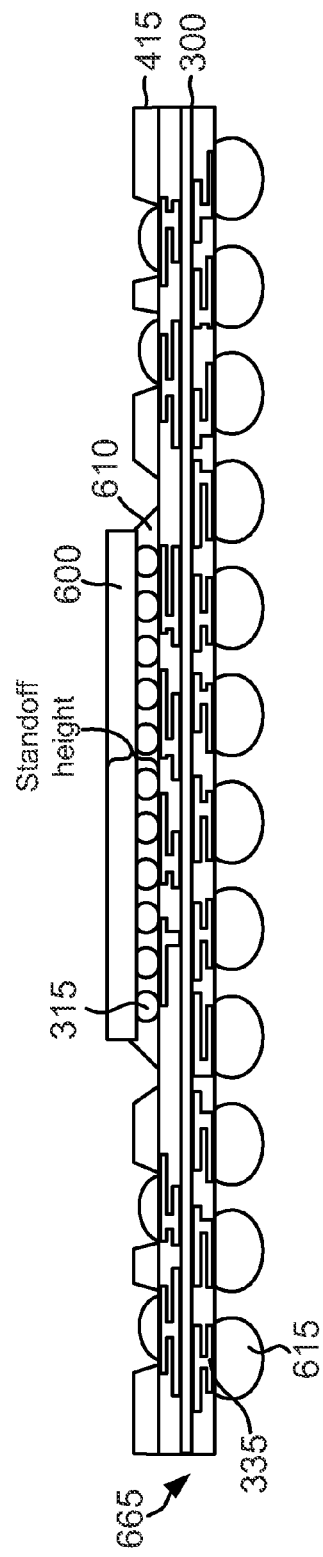
FIG. 6 is a cross-sectional view of the substrate of FIG. 5 modified to include a first package die so as to form a completed first package.

As shown in FIG. 6, a first package die 600 may then be flip-chip mounted on pre-solder FC bumps 315 and underfill 610 applied accordingly to provide a completed first package 605. In addition, printed circuit board (PCB-facing) balls 615 may be formed on pads 335 on the PCB-facing surface of first package 605.

Figure 7:
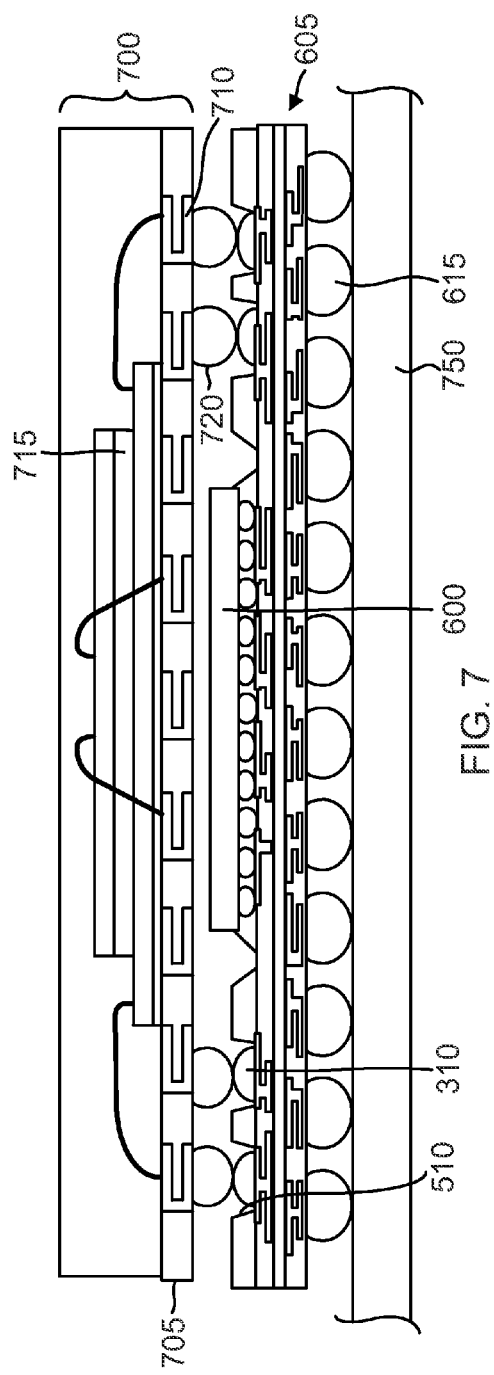
FIG. 7 is a cross-sectional view of a second package positioned on the first package of FIG. 6 to form a PoP stack prior to reflow.

To continue the manufacture, an appropriate placement tool positions second package 700 on first package 605 as illustrated in FIG. 7. Second package 700 includes a second package substrate 705 having pads 710 on its second-package-die facing surface and also on its first-package-facing surface. A second package die 715 is coupled to pads 710 on second package substrate 705 with wire bonds. Alternatively, second package 700 could also be a flip-chip package. In a second package memory embodiment, the number of input and output signals that are exchanged with the first package may be relatively small. Thus, in one embodiment, second package substrate 705 would not include metal layers as discussed with regard to first package substrate 300 such that pads 710 on the opposing surface of second package substrate 705 may be directly connected by straight-through metal-plated vias. However, it will be appreciated that second package substrate 705 may also include the metal layer routing discussed with regard to first package substrate 300. Second package 700 includes a plurality of second package balls 720 projecting from pads 710 on the first-package-facing surface of second package substrate 705. Second package balls 720 may comprise solder balls, copper pillars, or other types of package-to-package interconnects.

The distribution and arrangement of second package balls 720 on second package substrate 705 matches a distribution and arrangement of first package balls 310 on first package substrate 300. Thus, when second package 700 is aligned appropriately with first package 605 as shown in FIG. 7, each second package ball 720 is received by the via 505 surrounding the matching one of the first package balls 310. This is quite advantageous because via sidewalls 510 thus act to channel each second package ball 720 into a proper ball-to-ball alignment with the corresponding first package ball 310. In this fashion, no flattening or coining of first package balls 310 (or second package balls 720) is required to achieve this alignment. It may thus be seen that the patterned insulating layer 415 acts as a means for guiding the second package balls 720 into the desired ball-to-ball contact with the first package balls 310. Moreover, first package die 600 need not be ground or thinned to enable this high-density design. The pitch for balls 310 and 720 can thus be less than or equal to 0.4 mm yet the cost to manufacture is economical. In addition, no epoxy mold compound need be machined or laser ablated as first package 605 is a bare-die first package. The insulating layer is also a means for insulating the first package balls.

Referring again to FIG. 6, it can be seen that the thickness of solder resist layer 415 is less than the standoff height of first package die 600. Thus, although solder resist layer 415 is patterned, this layer is markedly thinner and more readily ablated or etched than die-encapsulating epoxy mold compound layer 130 that encapsulates first package die 120 as shown in the conventional over-molded PoP of FIG. 2. In addition, note that the patterning of resist layer 415 occurs as shown in FIG. 3, prior to attachment of first package die 600. The patterned first package substrate may then be tested to verify its behavior. In contrast, in the over-mold process discussed with regard to FIG. 2, the first package die is of course encased in the epoxy mold compound prior to formation of the vias. If the ablation of the vias leads to errors, the entire first package including the relatively expensive encapsulated die must then be discarded. In sharp contrast, the patterned first package substrate 300 of FIG. 5 is quite inexpensive as compared to first package die 600. Thus, if errors are found after patterning the solder resist layer, the patterned first package substrate may be discarded (or reworked if possible). In contrast, the cost of an error resulting from the machining or ablating of the vias in an over-molded first package is much greater. In this fashion, the PoP disclosed herein achieves the via-guided advantage of an over-molded first package without its associated costs. Moreover, the patterning of solder resist layer 415 into vias 505 and window 500 is faster and less error-prone than the patterning of the much thicker epoxy mold compound.

Figure 8:
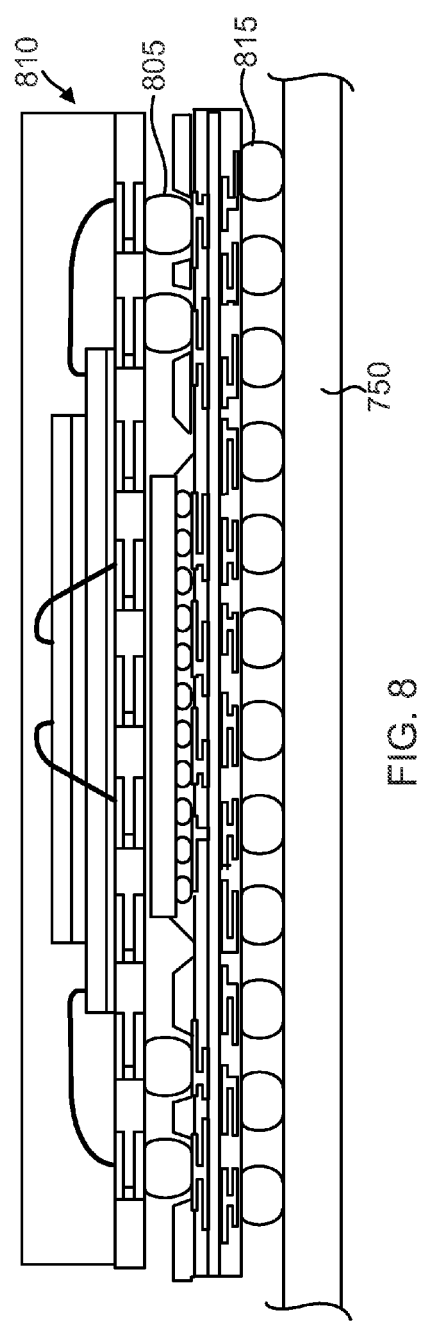
FIG. 8 is a cross-sectional view of the PoP stack of FIG. 7 after it has been reflowed to form a reflowed PoP stack.

Note that first package 605 and second package 700 may be coupled together to form a completed PoP on a printed circuit board (PCB) using either a single-pass reflow (SPR) or a two-pass reflow process as known in the PoP arts. In an SPR process, the completed first package 605 of FIG. 6 is placed onto a printed circuit board (PCB) 750 as shown in FIGS. 7 and 8. For example, PCB 750 may be paste-printed and completed first package 605 placed onto the paste-printed PCB. The second package balls 720 on second package 700 are flux or paste dipped so that the second package 700 may be attached to the circuit-board-placed first package 605 as shown in FIG. 7. The resulting assembly is then reflowed along with PCB 750 as shown in FIG. 8. The reflowed balls collapse into uniform structures 805 forming metallurgically strong bonds to both connect and electrically couple the first and second packages together to form a completed PoP structure 810. Similarly, this single reflow step reflows PCB-facing balls 615 to form surface mount technology (SMT) connections 815 between PoP 810 and printed circuit board 750.

In a two-pass process, first package 605 would not be positioned onto a PCB prior to the stacking of second package 700 as discussed with regard to FIG. 7. Instead, first package 605 is held in a fixture having a window for receiving PCB-facing balls 615 so that second package 700 may be positioned onto the fixture-held first package 605. The stacked first and second packages are then reflowed as discussed with regard to FIG. 8 to form what is denoted as a "pre-stack." PCB-facing balls 615 would of course be reflowed also in such a process but because they held within an open window on the fixture, balls 615 could then re-solidify without bonding to any circuit board. The resulting pre-stack would require a second reflow process when it is eventually mounted onto a circuit board. Although a two-pass process involves more steps, it does provide a manufacturer the ability to test the completed pre-stack before attachment to the PCB.

Alternatively, the manufacturing process discussed with regard to FIG. 6 may be modified to not include the deposition of PCB-facing balls 615 such that a completed first package 900 results as shown in FIG. 9. A second package may then be attached and the resulting combination reflowed to form a pre-stack 1000 as shown in FIG. 10. Such a process would be desirable if the printed circuit board is screened with solder such that balls 615 are unnecessary. Alternatively, balls 615 may be deposited on pre-stack 1000 prior to its attachment to a circuit board.

Figure 11:
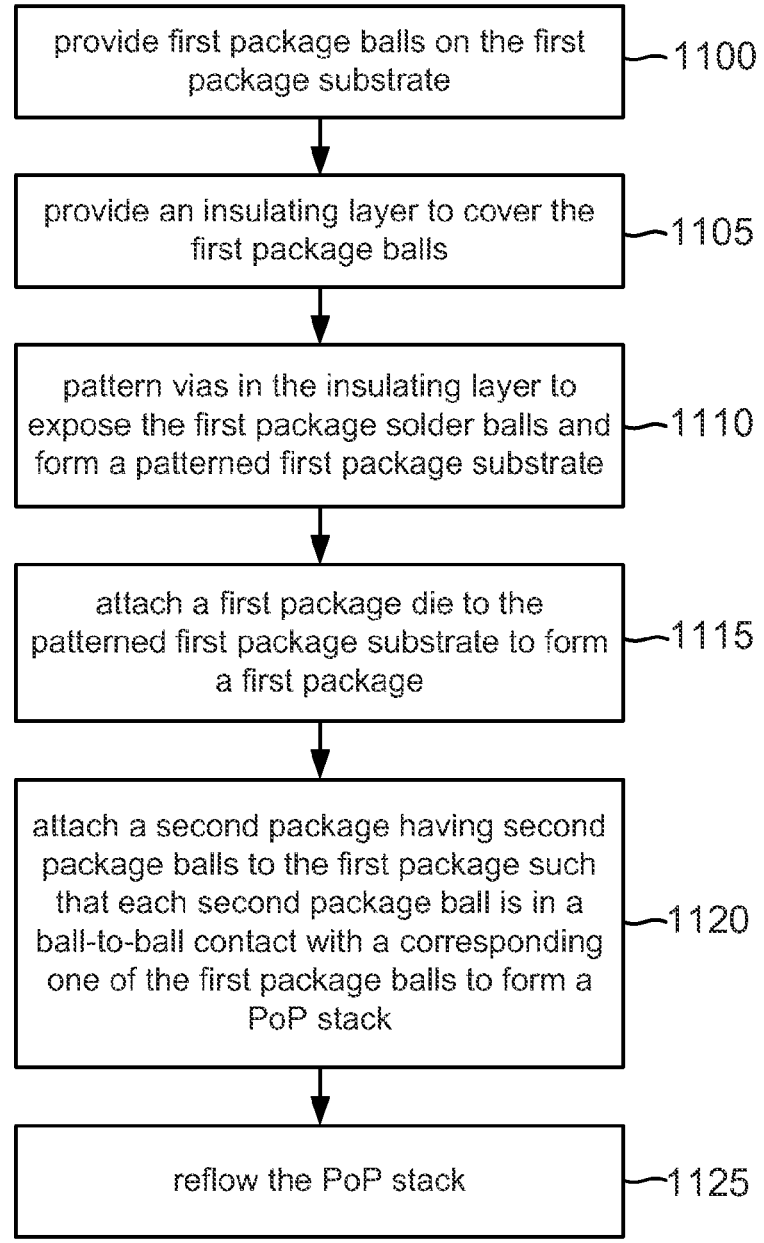
FIG. 11 is a flowchart for a PoP manufacturing process.

A method of making the advantageous PoP disclosed herein will now be summarized with regard to the flowchart of FIG. 11. In an initial step 1100, first package balls are provided on a first package substrate. In addition, the FC pre-solder bumps may also be provided should the first package die be a flip-chip die. Alternatively, no such flip-chip pre-solder bumps would be necessary if the first package is wire bonded. In a step 1105, an insulating layer is provided to cover the first package balls. The insulating layer is then patterned in a step 1110 to expose the first package solder balls in vias and to expose a die window in the resulting patterned insulating layer. For a flip-chip first package embodiment, the die window would expose the set of flip-chip solder bumps. In a step 1115, the first package die is mounted to the portion of the first package substrate surface exposed through the die window to complete the first package.

In a step 1120, a second package is placed onto the completed first package. In this placement, each second package ball on the second package contacts a corresponding exposed-within-its-via first package ball on the first package such that the second package ball is also received by the corresponding first package ball's via. To complete the PoP, the stacked first and second packages are reflowed in a step 1125.

Example Electronic Systems

Figure 12:
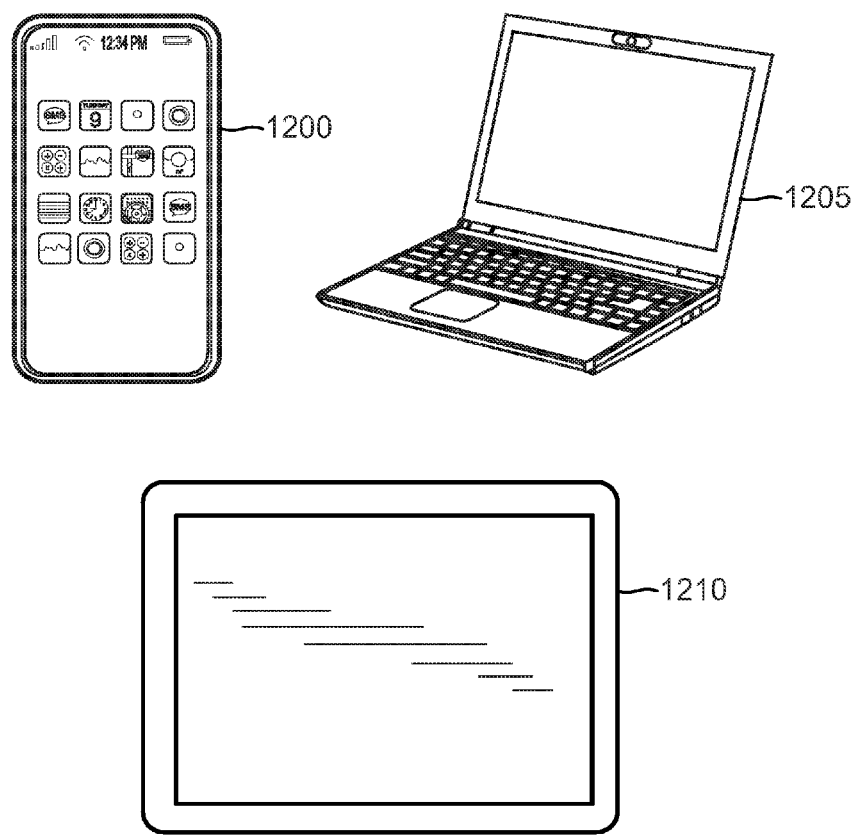
FIG. 12 illustrates a plurality of electronic systems incorporating a PoP in accordance with embodiments disclosed herein.

It will be appreciated that the PoP structures disclosed herein may be incorporated into a wide variety of electronic systems. For example, as shown in FIG. 12, a cell phone 1200, a laptop 1205, and a tablet PC 1210 may all include a PoP constructed in accordance with the disclosure. Other exemplary electronic systems such as a music player, a video player, a communication device, and a personal computer may also be configured with PoPs in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A first package for a package-on-package (PoP) structure, comprising:
a substrate having a first surface, the first surface supporting a plurality of first package balls having a first height, wherein each first package ball has a non-flattened surface facing away from the first surface of the substrate; and
an insulating layer on the first surface having a thickness greater than the first height, the insulating layer including a plurality of vias corresponding to the plurality of first package balls such that the non-flattened surface of each first package ball is exposed within a corresponding via, the insulating layer further including a die window for receiving a die onto a portion of the first surface exposed within the die window.

2. The first package of claim 1, further comprising a first die mounted on the portion of the first surface exposed within the die window, the mounted first die having a standoff height that is greater than the thickness of the insulating layer.

3. The first package of claim 2, wherein the mounted first die is a flip-chip mounted first die.

4. The first package of claim 2, wherein the insulating layer is a solder resist layer.

5. The first package of claim 2, wherein the first package is included within a package-on-package (PoP) stack including a second package, the second package further comprising a second package having a plurality of second package balls corresponding to the plurality of first package balls, the second package stacked onto the first package to form a PoP stack such that each second package ball is received within the via exposing a corresponding one of first package balls and such that each second package ball is in a ball-to-ball contact with the non-flattened surface of the corresponding first package ball.

6. The PoP stack of claim 5, further comprising a plurality of printed circuit board (PCB)-facing balls on a PCB-facing surface for the first package substrate.

7. The PoP stack of claim 5, wherein the first die is a processor integrated circuit and wherein a second die in the second package is a memory integrated circuit.

8. The PoP stack of claim 7, wherein the PoP stack is incorporated into at least one of a cellphone, a laptop, a tablet, a music player, a communication device, a computer, and a video player.

9. A package-on-package (PoP) structure, comprising:
a first package including a first package substrate having a first surface and a first package die on the first surface, the first package further including an insulating layer on the first surface, the insulating layer further including a die window configured to receive the first package die;
an underfill located between the first package die and the first surface of the first package, wherein the die window is sized such that the insulating layer is spaced apart from the underfill;
a second package including a second package substrate supporting a second package die on a first surface of the second package substrate; and
a plurality of interconnects configured to couple the first package to the second package.

10. The PoP structure of claim 9, wherein the first package die has a standoff height greater than an insulating layer thickness.

11. The PoP structure of claim 9, wherein the first package is a bare-die package.

12. The PoP structure of claim 9, wherein the first package die is a flip-chip die.

13. The PoP structure of claim 9, wherein the PoP structure is incorporated into at least one of a cellphone, a laptop, a tablet, a music player, a communication device, a computer, and a video player.

14. A method of manufacturing a package-on-package (PoP) structure, comprising:
depositing an insulating layer over a first surface of a first package substrate so as to cover a plurality of first package balls on the first surface, each first package ball having a non-flattened surface facing away from the first surface of the first package substrate;
patterning the deposited insulating layer to expose the non-flattened surface of each first package ball in a corresponding via through the deposited insulating layer and to form a die window through the deposited insulating layer to the first surface.

15. A first package for a package-on-package (PoP) structure, comprising:
a substrate having a first surface, the first surface supporting a plurality of first package balls having a first height, each first package ball having a non-flattened surface facing away from the first surface of the substrate; and
means for guiding second package balls into a ball-to-ball contact with the non-flattened surfaces of the first package balls, wherein the means has a thickness that is greater than the first height, the mean including a die window for receiving a die onto a portion of the first surface exposed within the die window.

16. The first package of claim 15, further comprising a first package die attached to the portion of the first surface exposed within the die window, and wherein the means thickness is less than a height for the first package die.

17. A package-on-package structure, comprising:
a first package including a first package substrate having a first surface and a plurality of first package balls and a first package die on the first surface, each first package ball having a non-flattened surface facing away from the first surface of the first package substrate; and
a second package including a second package substrate supporting a second package die on a first surface of the second package substrate and having a plurality of second package balls on an opposing second surface of the second package substrate, wherein the first package further includes an insulating means on the first surface of the first package substrate for insulating the plurality of non-flattened first package balls, the insulating means including a plurality of vias corresponding to the plurality of first package balls such that the non-flattened surface of each first package ball is exposed in a corresponding via, the insulating means having a thickness less than a height for the first package die.

18. The package-on-package structure of claim 17, wherein the insulating means comprises a solder resist layer.

* * * * *